United States Patent [19]

Warabisako et al.

[11] 4,354,115
[45] Oct. 12, 1982

[54] PHOTOCOUPLING DEVICE

[75] Inventors: Terunori Warabisako, Tokyo; Shigeo Shiono, Hitachi, both of Japan

[73] Assignee: Hitachi, Ltd., Tokyo, Japan

[21] Appl. No.: 211,125

[22] Filed: Nov. 28, 1980

[30] Foreign Application Priority Data

Nov. 30, 1979 [JP] Japan .................................. 54-154380

[51] Int. Cl.³ ...................... H01L 31/16; H01L 31/04
[52] U.S. Cl. .................................... 250/551; 136/244; 136/251; 136/246; 357/19
[58] Field of Search ............... 136/244, 251, 291, 246; 58/23 C; 250/227, 551, 552, 578; 350/96.1, 96.11, 96.15; 357/19

[56] References Cited

U.S. PATENT DOCUMENTS

| | | | |
|---|---|---|---|
| 3,427,797 | 2/1969 | Kimura et al. | 58/23 |
| 3,480,783 | 11/1969 | Mankarious | 250/211 |
| 3,560,750 | 2/1971 | Nagata | 330/4.3 |
| 3,786,624 | 1/1974 | Uchiyama | 58/23 C |
| 3,890,776 | 6/1975 | Urushida | 58/23 C |
| 4,001,704 | 1/1977 | Danielmeyer | 330/4.3 |
| 4,068,121 | 1/1978 | Bringhurst et al. | 250/227 |
| 4,074,143 | 2/1978 | Rokos | 250/552 |
| 4,087,960 | 5/1978 | Koichi | 58/127 R |
| 4,112,308 | 9/1978 | Olschewski et al. | 250/551 |
| 4,118,633 | 10/1978 | Guilleman | 250/551 |
| 4,124,860 | 11/1978 | Johnson | 357/19 |
| 4,151,005 | 4/1979 | Strebkov et al. | 136/256 |
| 4,210,923 | 7/1980 | North et al. | 357/30 |
| 4,249,959 | 2/1981 | Jebens | 136/244 |

Primary Examiner—Aaron Weisstuch
Attorney, Agent, or Firm—Antonelli, Terry & Wands

[57] ABSTRACT

A photo-coupler for electricity-light-electricity conversion comprising:
(1) a light emitting part;
(2) a photosensing device comprising a plurality of photosensing elements electrically connected in series in a light receiving surface of an insulating substrate, said photosensing elements being radially arrayed in said light receiving surface; and
(3) a light guiding means optically coupling said light emitting part and said photosensing device, whereby light is emitted from said light emitting part and directed through said light guiding means to said photosensing device to generate a photoelectric conversion output.

14 Claims, 10 Drawing Figures

PHOTOCOUPLING DEVICE

BACKGROUND OF THE INVENTION

This invention relates to a photosensing device comprising a plurality of photosensing elements, especially photovoltaic elements arrayed on a substrate.

A device, for example, a photo-coupler comprising a light emitting part and a photovoltaic part connected by a guiding part can be used for signal transmission under an electrically insulated condition to serve the purpose of energy transmission by means of electricity-light-electricity conversion.

FIG. 1 is a schematic sectional view of one form of such a photo-coupler. Referring to FIG. 1, the photo-coupler comprises a light source or light emitting part 1 including a plurality of light emitting diodes 8 arrayed on a substrate, and a photovoltaic part 2 including a plurality of photovoltaic elements 9 such as solar battery elements or solar cells arrayed on a substrate. The light emitting part 1 and the photovoltaic part 2 are optically coupled by a light guiding part 3 made of a glass, ceramic or like electrical insulator which is used to attain desired electrical insulation as well as desired physical coupling. In this guiding part 3, a specifically designed separate guide path 3' made of an optical glass or similar light transmitting material may be disposed so as to improve the transmission efficiency of light directed from the light emitting part 1 toward the photovoltaic part 2. Numerals 4,4' and 5,5' designate electrode leads connected to the light emitting part 1 and photovoltaic part 2 respectively, and numerals 6 and 7 designate mounts.

A photo-coupler such as that shown in FIG. 1 can be used for the purpose of supplying power to an electrically insulated electronic device, and many light emitting diodes are integrated in its light emitting part 1. A representative light emitting diode employed for the light emitting purpose generates optical output power of 50 mW at a wavelength of 800 nm. It is therefore required to integrate such diodes by the number of 40 so as to provide desired optical output power of, for example, 2 W.

By use of an optical guide such as that shown in FIG. 1, about 40% of the optical output power of 2 W can be transmitted from the light emitting part 1 to the photovoltaic part 2. However, as is commonly known, the improvement in the light transmission efficiency results generally in a nonuniform irradiance distribution at the photosensing part 2.

On the other hand, a voltage as high as, for example, 5 V is required for supplying operating power to the electronic device when the electronic devide is designed for processing of digital signals. Because of the peculiar properties of solar battery elements, a single solar battery element of, for example, silicon can only generate an output voltage as high as about 0.5 V at the most, and even a single solar battery element of gallium arsenide can only generate an output voltage of about 0.7 V. It is therefore necessary to connect many solar battery elements in series for attaining the desired output voltage level of 5 V.

It may be considered that solar battery elements having a rectangular shape as shown in FIG. 2 can be most easily industrially produced. FIG. 2 shows that a plurality of rectangular solar battery elements 21 are disposed in a circular light receiving surface 23. However, such an arrangement gives rise to various drawbacks which will be pointed out presently. Since the solar battery elements 21 are used under the condition of high irradiance or solar radiations, a grid electrode (not shown) is generally formed on the front surface of each of theelements 21 for the purpose of decreasing the surface resistance. Such a front surface electrode of each element is electrically connected to a back surface electrode of the next adjacent element, so that all the solar battery elements are electrically connected in series with each other. Further, it is necessary to define a gap 22 of suitable dimensions between the adjacent solar battery elements 21 so that the elements 21 may not short-circuit with one another. Consequently, the packing density of the solar battery elements 21 is reduced to such an extent that light is not fully effectively utilized for the signal transmission purpose. Further, nonuniformity of luminous intensity or irradiance distribution at the circular light receiving surface 23 results in mismatching of the electrical outputs of the individual elements 21, and this mismatching results, in turn, in a lowered total output of the photovoltaic part.

SUMMARY OF THE INVENTION

It is an object of the present invention to provide a novel and improved photosensing device which obviates all of the aforementioned defects and in which the photosensing elements, especially photovoltaic elements, can be effectively and simply connected in series while satisfying the requirement for a high packing density.

Another object of the present invention is to provide a photosensing device in which the photosensing elements, especially photovoltaic elements can generate substantially uniform electrical outputs even when the irradiance distribution at the light emitting part may be nonuniform.

In an embodiment of the photosensing device and/or photovoltaic device according to the present invention which attains the above objects, triangular photosensing and/or photovoltaic elements 31 are radially disposed in a light receiving surface 33 (shown by the one-dot chain line) as shown in FIG. 3.

By virtue of such an arrangement of the triangular photosensing elements 31, the gap 32 to be defined between the adjacent elements 31 can be reduced to a minimum required for preventing short-circuiting due to electrical contact of the elements 31 with each other, so that light directed from a light emitting part toward the photosensing and/or photovoltaic part through a guiding part can be fully effectively utilized for the purpose of photoelectric and/or photovoltaic conversion. Although non-uniformity in irradiance at the photosensing part may increase in the radial direction when the optical transmission efficiency of th guiding part is improved, a uniform irradiance distribution can be relatively easily provided in the circumferential direction thereby averaging the optical input power applied to the individual photosensing elements 31. Therefore, the electrical outputs of the individual photosensing elements 31 connected in series can be well matched to improve the total output of the photosensing part.

DESCRIPTION OF THE PREFERRED EMBODIMENTS

Preferred embodiments of the present invention will now be described in detail with reference to FIGS. 4 to 10.

Figure 4:
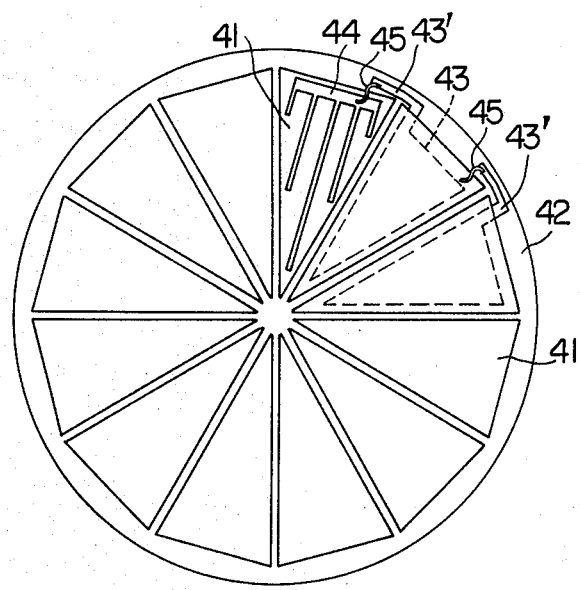
FIG. 4 is a schematic plan view of an embodiment of the photosensing device according to the present invention.

A preferred embodiment of the photosensing and/or photovoltaic device according to the present invention is shown in a schematic plan view in FIG. 4. In the embodiment shown in FIG. 4, a plurality of, for example, twelve photosensing (and/or photovoltaic) elements 41 such as solar battery elements of triangular shape are radially disposed in a light receiving surface. These solar battery elements 41 are arrayed in such a radial pattern on a substrate 42 made of a ceramic, epoxi-glass or similar electrical insulating material. Such solar battery elements 41 may be cut by mechanical means from a wafer. In lieu of the mechanical cutting, such plural solar battery elements 41 may be provided in an individually isolated relation on a single wafer by means of life-time decaying isolation, for example, through electron beam irradiation. Also, after connection of necessary leads to a single wafer, such elements 41 may be provided in an individually isolated relation by means of a laser beam or the like. The substrate 42 is provided with a plurality of metalization patterns 43 each of which is electrically connected to the back surface electrode of the associated one of the solar battery elements 41 and has a lead portion 43' extending to terminate near the next adjacent solar battery element 41. The back surface electrode may cover the entire back surface of each of the solar battery elements 41, and only two of the metalization patterns 43 lying beneath the associated solar battery elements 41 are shown by dotted lines in FIG. 4. The lead portions 43' of the metalization patterns 43 are disposed close to the radial outer sides of the solar battery elements 41 radially arrayed on the substrate 42.

In one form, the metalization patterns 43 are provided by copper foils deposited on the substrate 42 when the material of the substrate 42 is epoxi-glass. In another form, the metalization patterns 43 are provided by a molybdenum metalization layer plated with a metal, for example, gold. Desirably, solder is applied to these metals.

A grid electrode 44 is provided on the front surface of each of the solar battery elements 41. (In some cases, a bonding pad may merely be provided on the surface diffused layer of each solar battery element 41). The grid electrode 44 on each of the solar battery elements 41 is suitably electrically connected to the metalization pattern 43 underlying the next adjacent element 41 by means such as a lead wire 45 so that the adjoining elements 41 can be electrically connected in series with each other. Further, these metalization patterns 43 are bonded by a layer of solder to the back surface electrodes of the associated solar battery elements 41. The back surface electrodes and the metalization patterns 43 may both be deposited in a suitable form such as a grid form, a mesh form or a scattered dot form.

Figure 5:
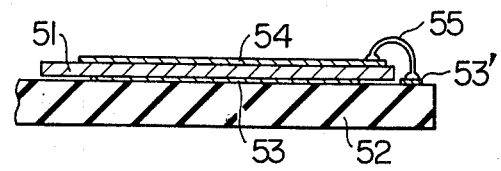
FIG. 5 is a schematic sectional view of part of the device shown in FIG. 4.

FIG. 5 is a schematic sectional view of part of the photosensing and/or photovoltaic device shown in FIG. 4. Referring to FIG. 5, the illustrated structure includes a solar battery element 51, an insulating substrate 52, a layer 53 formed by bonding a back surface electrode of the element 51 to a metalization pattern deposited on the substrate 52, a grid electrode 54 provided on the front surface of the element 51, and a lead wire 55 electrically connecting the grid electrode 54 of the element 51 to a lead portion 53' extending from the metalization pattern bonded to the back surface electrode of the next adjacent element 51.

Figure 6:
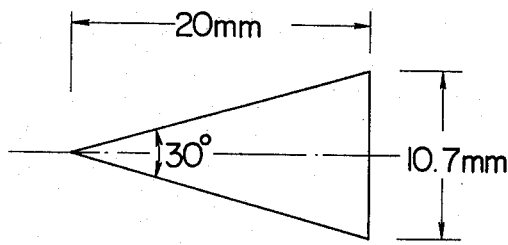
FIG. 6 shows an example of the dimensions of one of the photosensing elements preferably used in the device shown in FIG. 4.

FIG. 6 shows an example of the dimensions of each of the triangular solar battery elements employed in the device shown in FIG. 4. The element shown in FIG. 6 has a thickness of about 400μ.

Figure 7:
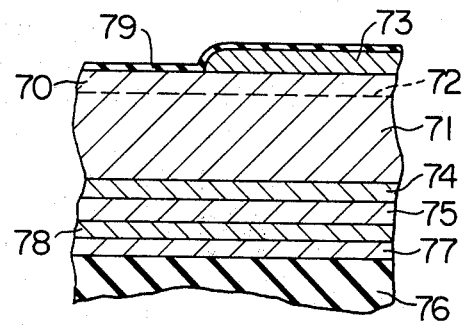
FIG. 7 is an enlarged partial detail view of the structure shown in FIG. 5.

FIG. 7 is an enlarged schematic sectional view showing, in detail, part of the structure of one form of the solar battery element preferably employed in the device of the present invention. Referring to FIG. 7, the solar battery element includes a substrate 71 of silicon of p-type conductivity having generally a resistivity of 0.5 to 10 Ω-cm. An n-type diffusion layer 70 is formed in the surface region of the p-type substrate 71 by diffusion of a group V impurity such as phosphorus to provide a p-n junction 72 shown by the dotted line. A grid electrode 73 is deposited on the surface of the n-type diffusion layer 70 by vacuum evaporation of a metal such as Ti, Ni and Ag and, then, a layer of solder is applied. In the illustrated structure, the material of the grid electrode 73 is a Ti/Ag composition. A metal layer such as an Al-alloy layer 74 is formed on the p-type silicon layer 71 and is covered with a back surface electrode 75 provided by a process similar to that used for providing the grid electrode 73. The material of the back surface electrode 75 is a Ti/Ag/Ni composition and covers the entire back surface. A substrate 76 of ceramic or similar electrical insulating material is metalized on one of its surfaces with a metalization layer 77 such as copper, and this metalization layer 77 is bonded to the back surface electrode 75 by a layer of solder 78. An antireflection film 79 of $SiO_2$ or like material having a reflection index and a thickness optimized for preventing reflection of incident light covers the front surface of the solar battery element.

The material of the back surface electrode 75 as well as that of the grid electrode 73 is not limited to those described above and may be any one of other metal compositions including Ti/Ni/Ag and Cr/Ni/Ag. Further, the back surface electrode 75 may also be provided in a grid form, a mesh form or a scattered dot form.

Figure 1:
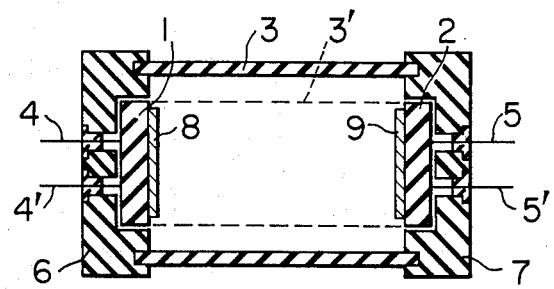
FIG. 1 is a schematic sectional view showing the structure of a photo-coupler.
Figure 2:
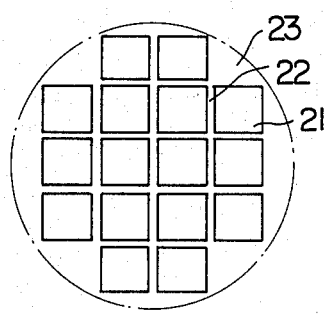
FIG. 2 is a schematic plan view showing the arrangement of photosensing elements in a photosensing device which may be considered to be most easily industrially produced.
Figure 3:
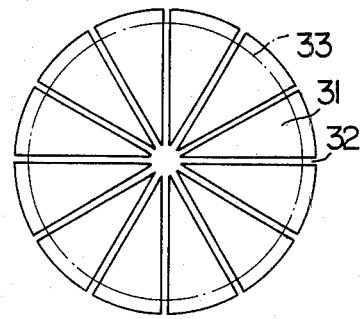
FIG. 3 is a schematic plan view showing the arrangement of photosensing elements in a photosensing device according to the present invention.

The meritorious effects of the embodiment of the present invention will now be described. The photovoltaic part of the photovoltaic device according to the present invention was formed by connecting in series twelve photovoltaic elements, each of which is in the form of an isosceles triangle having a central angle of 30° and an area of 1.07 cm². The ratio of the active area of the elements to the total area of the photovoltaic part is 0.74, whereas that in the device shown in FIG. 2 is about 0.5.

The light source part was constructed by integrating forty-two infrared light emitting diodes each generating rated optical output power of 50 mW. These diodes were connected in series, and a voltage of 60 V was applied across the input terminals to supply rated input current of 0.2 A. The light guide part had an axial length of 50 mm. The electrical output power derived from this photovoltaic part due to the photovoltaic conversion of light emitted from the light source part and transmitted through the light guide part was 157 mW=5.6 V×28 mA.

Figure 8:
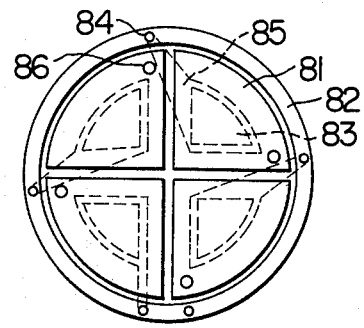
FIG. 8 is a schematic plan view of another embodiment of the photosensing device according to the present invention.

FIG. 8 is a schematic plan view of another embodiment of the photosensing and/or photovoltaic device according to the present invention. This embodiment can eliminate the bonding process required in the embodiment shown in FIG. 4.

Referring to FIG. 8, a plurality of, for example, four generally triangular solar battery elements 81 are radially disposed and fixed within a package 82 in isolated relation from each other. The package 82, which is made of a ceramic or similar heat-resistive electrical insulating material, is provided with bonding pads 83 for electrical connection to the back surface of the elements 81 and metalized layer portions 85 electrically connecting the individual bonding pads 83 to associated binding posts 84 upstanding from the outer peripheral area of the package 82. Solder is applied to the bonding pads 83 and binding posts 84 prior to the insertion of the solar battery elements 81 in the package 82.

Figure 9:
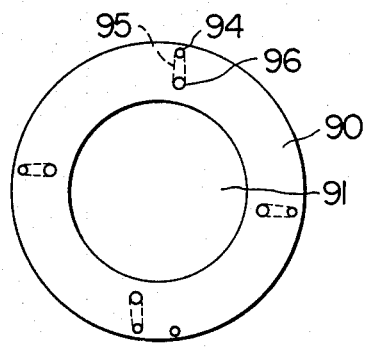
FIG. 9 is a schematic plan view of the cover of the device shown in FIG. 8.

A cover 90 as shown in FIG. 9 is used in combination with the package 82. On the cover 90, binding posts 94 and 96 are provided at positions opposite to the binding posts 84 of the package 82 and post-shaped electrodes 86 of the solar battery elements 81 respectively, and metalized layer portions 95 are provided for establishing electrical connections between the binding posts 94 and 96 in the respective pairs. Solder is similarly applied to these binding posts 94 and 96.

Figure 10:
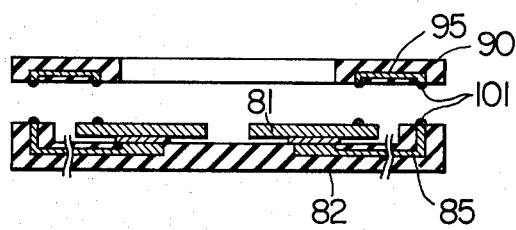
FIG. 10 is a schematic sectional view showing the structure of the package and cover of the device shown in FIG. 8.

As shown in a sectional view in FIG. 10, the cover 90 shown in FIG. 9 is superposed on the element-holding package 82 shown in FIG. 8 in such a relation that the associated electrodes or posts covered with the solder bumps 101 confront each other, and, then, heat is applied until the melting point of the solder is reached for the purpose of reflow bonding.

The above process reduces the labor required for interconnection of the plural solar battery elements and accommodation of the elements in the package. The second embodiment is therefore industrially advantageous over the first embodiment which requires the aforementioned bonding and packaging processes.

The cover 90 in the photovoltaic part of the second embodiment of the present invention is illustrated as having an opening 91 through which light passes toward the photovoltaic elements. However, this opening 91 may be covered with a transparent glass or like transparent material. When there is a requirement for hermetically sealing the peripheral area of the device, isolated matalized layers may be provided on the peripheral areas of the package and cover, so that the peripheral area of the device can be hermetically sealed when the cover is superposed on the package and bonded to the latter by the solder reflow bonding.

Although the second embodiment has been illustrated to include four photosensing and/or photovoltaic elements by way of example, the present invention is equally effectively applicable to a photosensing and/or photovoltaic device including more photosensing and/or photovoltaic elements, and the advantages of the present invention are exhibited in a greater degree with the increase in the number of such elements.

We claim:

1. A photo-coupler for electricity-light-electricity conversion comprising:
   (1) a light emitting part;
   (2) a photosensing device comprising a plurality of photosensing elements electrically connected in series in a light receiving surface of an insulating substrate, said photosensing elements being radially arrayed in said light receiving surface; and
   (3) a light guiding means optically coupling said light emitting part and said photosensing device,
   whereby light is emitted from said light emitting part and directed through said light guiding means to said photosensing device to generate a photoelectric conversion output.

2. A photo-coupler as claimed in claim 1, wherein said light emitting part is a plurality of light emitting diodes.

3. A photo-coupler as claimed in claim 1 or 2, wherein said light guiding means is made of an electrically insulating material.

4. A photo-coupler as claimed in claim 3, wherein said light guiding means is made of glass or ceramic.

5. A photo-coupler as claimed in claim 1, wherein said photosensing elements are electrically connected in series by lead portions disposed external to the array of photosensing elements.

6. A photocoupler device as claimed in claim 1, wherein each of said photosensing elements extends from the central portion of said light receiving surface to the peripheral portion thereof.

7. A photocoupler device as claimed in claim 6, wherein each of said photosensing elements has a central angle of 360°/n, where n is the number of said photosensing elements, the two sides defining each central angle extend radially from the central portion of said light receiving surface, and said photosensing elements are electrically connected in series with each other at the peripheral portion of said light receiving surface.

8. A photocoupler device as claimed in claim 1, 6 or 7, wherein said substrate is provided with a plurality of metalization patterns at positions corresponding to said plural photosensing elements respectively, said metalization patterns including lead portions disposed external to the array of said photosensing elements, and each of said photosensing elements is electrically connected at its back surface electrode to one of said metalization patterns and at its front surface electrode to the lead portion of the next adjacent metalization pattern.

9. A photocoupler device as claimed in claim 8, wherein the lead portion of said metalization pattern is connected to the front surface electrode of said photosensing element by bonding a lead wire therebetween.

10. A photocoupler device as claimed in claim 8, further comprising a cover provided with a metalized layer, the lead portion of said metalization pattern being connected to the front surface electrode of said photosensing element by a portion of said metalized layer.

11. A photocoupler device as claimed in claim 10, wherein said cover is bonded by solder bonding to said photosensing elements by the connection of said portion of said metalized layer with said lead portion of said metalization pattern.

12. A photocoupler device as claimed in claim 10, wherein said cover has an opening through which light passes towards said photosensing elements.

13. A photocoupler device as claimed in claim 8, wherein said substrate is made of epoxi-glass, and said metalization patterns are provided by copper.

14. A photocoupler device as claimed in claim 8, wherein said substrate is made of a ceramic material, and said metalization patterns are provided by gold plated molybdenum.

* * * * *